(12) United States Patent
Turbett et al.

(10) Patent No.: US 6,754,603 B2
(45) Date of Patent: Jun. 22, 2004

(54) VIRTUAL VEHICLE TRANSMISSION TEST CELL

(75) Inventors: Marlin R. Turbett, New Hudson, MI (US); Robert M. Senseney, Tecumseh, MI (US); Steven D. Nash, Lyons, MI (US); Michael R. Rosati, Pinckney, MI (US); David T. Stark, Superior Township, MI (US); Alfonso G. Hysko, Belleville, MI (US); Robert W. Tator, Belleville, MI (US); David L. Joseph, Southfield, MI (US); Paul A. Piorkowski, Belleville, MI (US); Gary L. Stecklein, San Antonio, TX (US); Matthew S. Castiglione, Rio Medina, TX (US); Joe Steiber, San Antonio, TX (US); Benjamin A. Treichel, Waterford, MI (US); Bapiraju Surampudi, San Antonio, TX (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 10/374,682

(22) Filed: Feb. 25, 2003

(65) Prior Publication Data

US 2003/0167143 A1 Sep. 4, 2003

Related U.S. Application Data

(60) Provisional application No. 60/361,605, filed on Mar. 4, 2002.

(51) Int. Cl.⁷ .............................. G01M 7/00; G06F 19/00
(52) U.S. Cl. ........................ 702/113; 702/114; 307/10.1; 701/51; 180/337
(58) Field of Search .................................. 702/113, 108, 702/114; 73/116, 117, 118.1, 865.9, 862.16, 866.4; 307/10.1; 701/51; 434/380; 180/337

(56) References Cited

U.S. PATENT DOCUMENTS

| | | | |
|---|---|---|---|
| 4,159,642 A | 7/1979 | Hudson et al. | 73/118 |
| 4,385,518 A | 5/1983 | Rickett | 73/117 |
| 4,391,131 A | 7/1983 | Scourtes | 73/118 |
| 4,468,958 A | 9/1984 | Takeshita | 73/118 |
| 4,799,158 A | 1/1989 | Patil | 364/424.1 |
| 4,939,985 A | 7/1990 | Von Thun | 73/118.1 |
| 4,984,988 A | 1/1991 | Mizushina et al. | 434/380 |
| 5,060,176 A | 10/1991 | Nawa et al. | 364/579 |
| 5,085,071 A | 2/1992 | Mizushina et al. | 73/118.1 |
| 5,097,699 A | 3/1992 | Sano et al. | 73/118.1 |
| 5,144,834 A | 9/1992 | Sano et al. | 73/118.1 |
| 5,249,458 A | 10/1993 | Sano et al. | 73/117 |
| 5,537,865 A | 7/1996 | Shultz | 73/118.1 |
| 6,155,948 A | 12/2000 | Gierer | 475/123 |

*Primary Examiner*—John Barlow
*Assistant Examiner*—Hien Vo
(74) *Attorney, Agent, or Firm*—Leslie G. Hodges

(57) ABSTRACT

The virtual vehicle transmission test cell includes an electric motor which simulates a fuel driven engine, an output motor which simulates the load a transmission experiences in a vehicle, and an environmental element which controls the ambient environment of the transmission and the temperature of the transmission oil within the transmission. The virtual vehicle transmission test cell reduces in-vehicle testing, reduces testing with fuel-driven test cells, and enables development of a transmission design before a corresponding engine is completed and built for testing.

27 Claims, 11 Drawing Sheets

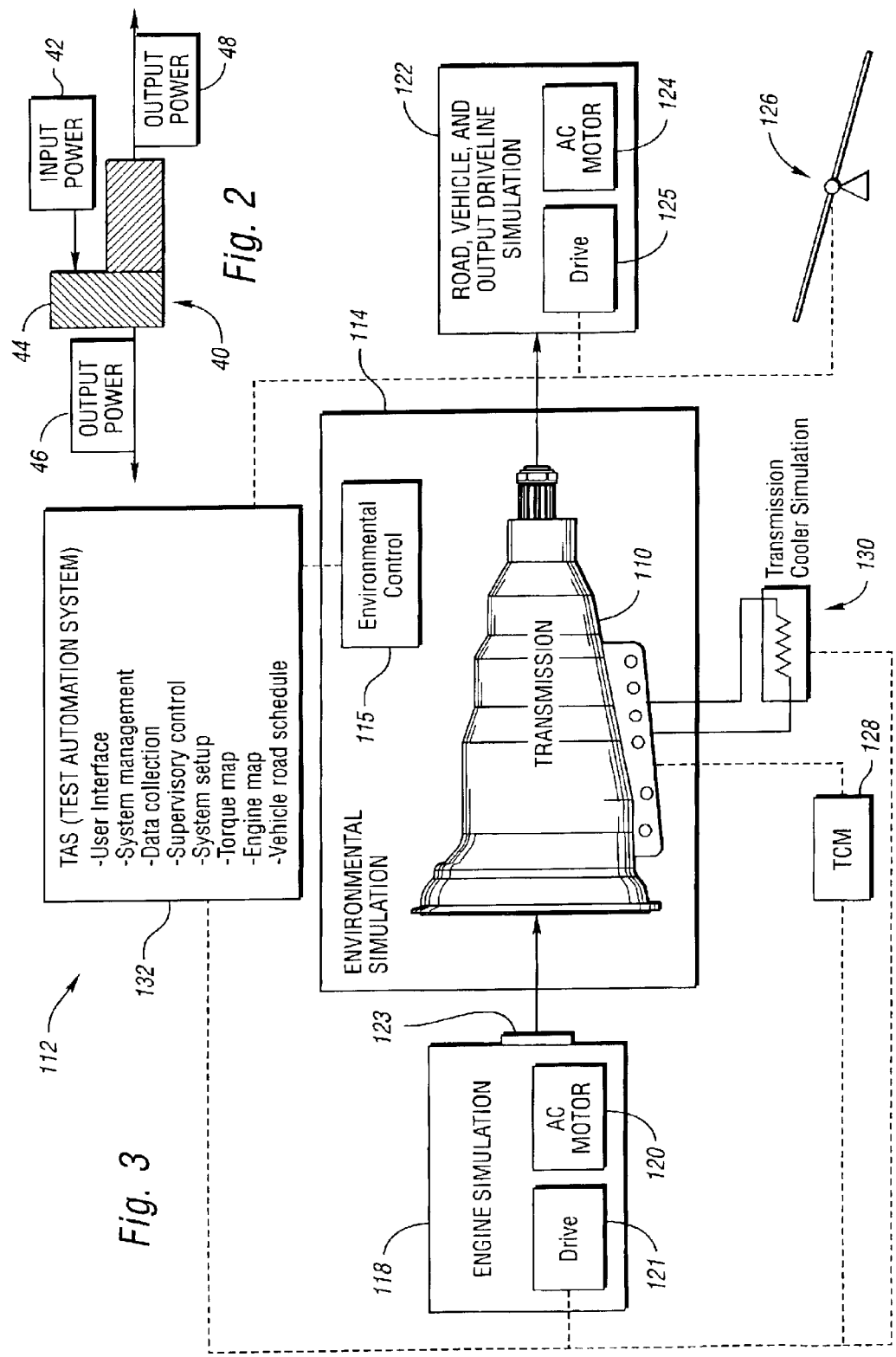

VIRTUAL VEHICLE TRANSMISSION TEST CELL

CROSS REFERENCE TO RELATED APPLICATION

This application claims priority to U.S. Provisional Application Ser. No. 60/361,605, filed Mar. 4, 2002.

TECHNICAL FIELD

The present invention relates to a virtual vehicle transmission test cell including an input motor, an output motor, environmental controls, and a transmission cooler for cycling a transmission through predetermined test schedules without installing the transmission in a vehicle to perform the testing.

BACKGROUND OF THE INVENTION

Traditionally, automotive transmissions have been tested in a transient state by installing the transmissions in test vehicles or by attaching the transmissions to test engines. Such conventional testing has provided various challenges.

For instance, in order to use an internal combustion engine for testing, various engine accessories, such as a fuel supply system, an exhaust system, an ignition system, and so forth, are required. Furthermore, the clean testing environment requires a ventilation system and noise proof facility. Accordingly, facility costs become significant when using an internal combustion engine for testing transmissions.

Also, the performance of the internal combustion engine tends to be influenced by environmental conditions, such as atmospheric temperature, pressure, etc. These conditions are difficult to simulate, therefore the test results may be unreliable.

Further, since the test is performed by utilizing the engine which is to be used with the transmission, the transmission test cannot be performed unless the engine is provided. Accordingly, when a new engine and transmission are to be developed, testing of the transmission cannot be performed until after the engine design is completed and the engine is built. Therefore, development of the transmission is delayed in relation to timing of the engine design and build.

To date, no transmission test device has been able to use an electric motor to simulate the engine in the transient test condition because electric motors typically have a much higher angular mass moment of inertia than that of an engine. The inertia increases with increasing horsepower. Accordingly, a transmission attached to such a motor with a high moment of inertia would likely be destroyed in a transient test.

SUMMARY OF THE INVENTION

The present invention provides a virtual vehicle transmission test cell in which a low inertia input motor is used to simulate vehicle engine torque, speed and inertia; an output motor is used to simulate the load that a transmission experiences in a vehicle; and an environmental simulation provides control of ambient conditions and transmission cooling.

The virtual vehicle transmission test cell is a test facility that tests the transmission while simulating other vehicle interfaces. These interfaces are transmission control, engine power, driveline, gross vehicle weight, vehicle acceleration, aerodynamic drag, rolling resistance, road courses, transmission mounting attitude and transmission thermal environment and vehicle heat rejection. This test cell enables transmission development to move from the road to the lab while incorporating math modeling for the interfaces.

The virtual vehicle transmission test cell combines several technologies not previously integrated in a test facility. The first key technology is a low inertia, high response AC motor and drive. This motor has performance to simulate engine inertia, which includes the ability to make the apparent inertia of the motor more or less than the motor such that it can simulate the torque of a fuel firing engine. The motor has the capability to simulate a high fidelity torque trace driven by firing pulses of the fuel firing motor. The input motor simulates engine speed and torque during transmission shifting, and is capable of handling thrust loads generated by the transmission. The motor is also tiltable so that different transmission installation angles can be tested.

A transmission controller is used to run transmission control algorithms. Alternatively, a production controller may be used and tested along with the transmission. The thermal environment the transmission experiences in a vehicle is simulated by an environmental controller. A transmission cooler is also provided to control oil temperature of the transmission. This laboratory transmission cooler simulates a variety of cooling systems from a range of vehicles. An output motor simulates vehicle imposed loads so that the output system responds like the desired vehicle driveline. The output motor simulates vehicle load conditions using mathematical road course data so that the transmission experiences a close approximation of in-vehicle output loads.

The virtual vehicle transmission test cell allows transmissions to be developed when the corresponding engines and/or vehicles do not yet exist.

According to one aspect of the invention, a system for testing an automotive transmission according to a predetermined test schedule which avoids having to install and drive the transmission in a vehicle to perform the testing is provided. The system includes an input motor operatively connectable to an input of the transmission for providing rotational drive thereto in simulation of the predetermined test schedule. An output motor is operatively connectable to an output of the transmission for providing rotational resistance thereto in simulation of the predetermined test schedule. An environmental chamber substantially encloses the transmission, and an environmental controller controls the ambient conditions within the environmental chamber. A transmission cooler is provided for controlling the rejection of heat from the transmission. The predetermined test schedule includes gear shifting of the transmission between a plurality of forward speed ratios, and at least one reverse speed ratio.

The system may also include an apparatus for adjusting angular articulation of the transmission. Further, an input motor controller is provided for controlling rotational drive of the input motor to selectively simulate the speed, acceleration, torque, inertia and/or other performance aspects of an engine according to selected speed, throttle position, torque mapping and/or other parameters. An output controller is provided for selectively controlling the rotational resistance of the output motor to selectively simulate the speed, deceleration, torque, inertia and/or other performance aspects of an after-transmission drive train of a selected vehicle according to selected vehicle aerodynamics, vehicle mass, road conditions, air/weather conditions, load carrying, torque mapping and/or other parameters. The after-transmission drive train includes one or more of a drive shaft, a differential unit, a power take off unit, and a set of wheels.

A plurality of speed, torque, temperature, pressure, position, flow rate, humidity, and/or other sensors are operatively arranged to detect various speeds, torques, temperatures, pressures, positions, flow rates, humidities, and/or the like at selected points in the system.

The transmission cooler includes means for selectively controlling the temperature differential between a supply of transmission fluid to the transmission and a return of transmission fluid from the transmission and/or means for selectively controlling the flow rate of at least the supply of transmission fluid to the transmission. The first heat exchanger is connected to the supply and return of transmission fluid, and can be situated inside or outside of the environmental chamber. The means for selectively controlling the restriction (line back pressure) includes a variable orifice valve. A shunt and second heat exchanger may also be provided inside or outside the environmental chamber in communication with the supply and return of transmission fluid to simulate the vehicle or required test conditions.

A ratio-changing gear box may be operably connected to the output motor and operably connectable to the output of the transmission.

A transmission controller may be provided for selectively controlling the gear shifting of the transmission in response to virtual vehicle speed and virtual throttle position according to the predetermined shift schedule.

A test automation system controller (TAS) may be operatively connected with the input motor controller, the output motor controller, the environmental controller and the transmission cooler for controlling testing of the transmission. Further, all components of the virtual test cell may be controlled by the test automation system.

An input torque meter may be operatively connected to the input motor and an output torque meter may be operatively connected to the output motor and the output motor controller.

The apparatus for adjusting angular articulation may comprise a platform supported by a plurality of hydraulically adjustable supports to provide six degrees of freedom in attitude adjustment.

Preferably, the input motor is a 330 kW, 9000 rpm AC motor with an inertia simulation capability between approximately 0.05 and 0.25 kgm$^2$, or preferably approximately 0.12 kgm$^2$ to simulate the inertia of a V8 engine. The dynamometer (i.e., the motor and motor controller) includes a PWM converter with a closed loop flux vector voltage inverter.

According to another aspect of the invention, a method is provided for virtual vehicle testing of an automotive transmission according to a predetermined test schedule which avoids having to install and drive the transmission in a vehicle to perform the testing. The method includes the steps of:

a. providing a virtual vehicle test system as described above;

b. installing a transmission into the virtual vehicle test system, such that the input and output of the transmission are operatively connected to the input motor and output motor, respectively;

c. operating the input motor through means for selectively controlling the rotational drive thereof to simulate a selected engine according to the predetermined test schedule, and operating the output motor through means for selectively controlling the rotational resistance thereof to simulate a selected vehicle and selected vehicle affecting conditions according to the predetermined test schedule;

d. permitting the transmission to shift among its various gears according to the predetermined shift schedule in response to the virtual vehicle speed and virtual throttle position; and e. evaluating the performance of the transmission in its execution of the shifting of step d according to preselected performance criteria.

The method may further comprise modifying the transmission and/or the predetermined shift schedule, and repeating steps c, d and e.

According to a further aspect of the invention, a process is provided for optimally matching the candidate vehicle and engine designs with candidate transmission designs which avoids having to install and drive a corresponding physical transmission in a corresponding physical vehicle having a corresponding physical engine. The process includes the steps of:

a. selecting a candidate vehicle design and a candidate engine design;

b. obtaining respective performance characteristics for the candidate vehicle and engine designs according to at least one base line test schedule;

c. selecting a candidate transmission design;

d. selecting a shift schedule for the candidate transmission design;

e. providing a physical transmission corresponding to the candidate transmission design;

f. testing the physical transmission in the virtual vehicle test system as described above;

g. evaluating the performance of the physical transmission according to preselected performance criteria;

h. executing at least one step selected from a group comprising:
  i. modifying the physical transmission,
  ii. selecting an alternate candidate vehicle design and obtaining performance characteristics therefor according to the previously selected at least one test schedule,
  iii. selecting an alternate candidate engine design and obtaining performance characteristics therefor according to the previously selected at least one test schedule,
  iv. obtaining new performance characteristics for the candidate vehicle and/or engine design according to an alternate test schedule,
  v. selecting an alternate candidate transmission design and providing an alternate physical transmission corresponding thereto, and
  vi. selecting an alternate shift schedule;

i. Repeating at least steps f and g.

Further, steps f through i above may be repeated as needed until the performance of the physical transmission substantially meets the preselected performance criteria.

The virtual vehicle transmission test cell may also be used to test the performance of a transmission controller to be used with the transmission.

Accordingly, benefits to be realized by using the invention include removing the transmission from the critical development path of vehicle programs; improving the development environment; reducing costs by elimination of fuel and fuel handling in exhaust facilities of the laboratory; enhancing capability to test engines and vehicles that do not yet exist; reducing cost of the development process due to more controlled testing and removal of vehicles from road testing; and providing potential to perform validation and calibration in a test cell instead of on the road.

The above objects, features, advantages and other objects, features and advantages of the present invention are readily apparent from the following detailed description of the best modes for carrying out the invention when taken in connection with the accompanying drawings.

BRIEF DESCRIPTION OF THE DRAWINGS

FIG. 2 is a schematic illustration of power flow to and from a front wheel drive transmission to be tested.

FIG. 3 is a schematic illustration of a virtual vehicle transmission test cell in accordance with the invention.

DESCRIPTION OF THE PREFERRED EMBODIMENTS

Figure 1:
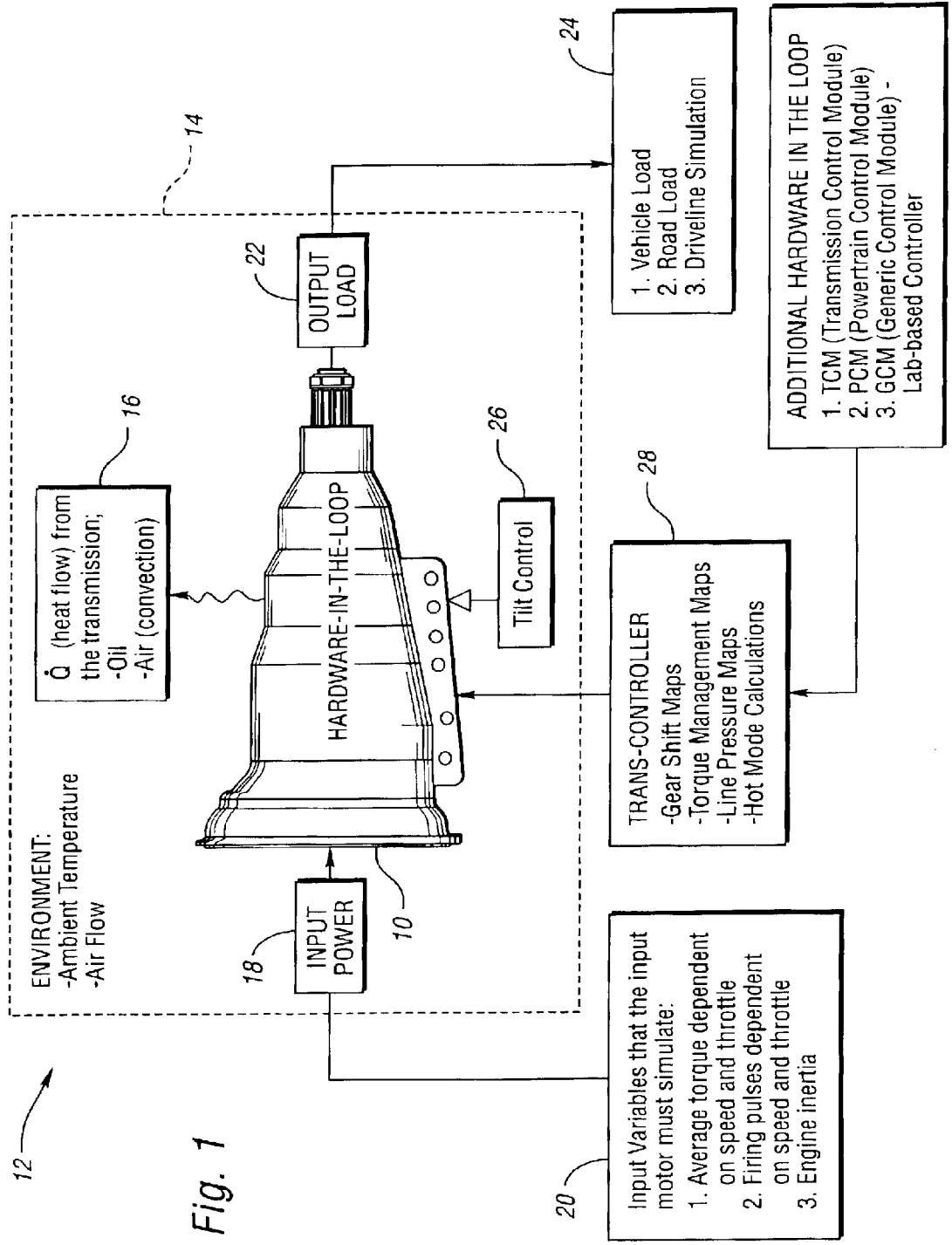
FIG. 1 shows a schematic illustration of hardware in a test loop for a rear wheel drive transmission.

A virtual vehicle transmission test cell in accordance with the invention has three main elements. There is an input element, which is an electric motor that simulates a fuel driven engine, in terms of torque, speed and inertia. There is an output element, which is an electric motor and associated couplings that simulate the load that a transmission experiences in a vehicle. The third element is an environmental element which includes the physical environment around the transmission, including the thermal environment and the installation angle of the transmission. The purpose of this test cell is to reduce in vehicle testing, reduce testing with fuel driven test cells, and provide capability of testing a transmission without relying upon an engine and vehicle that are not yet developed or built.

In order to understand the three main elements of the test cell, the terms "road load", "engine inertial simulation", "thermal control system", and "transmission attitude" must be described. "Road load" refers to the load (torque) that must be applied to the output shaft(s) of a transmission to simulate the combined effects of the driveline compliance and other driveline characteristics as well as vehicle mass, road grade, rolling resistance, and wind resistance on the vehicle. Thus, the output shaft of the transmission experiences the same reaction torque that would be applied in a vehicle. In the virtual vehicle transmission test cell, an electric motor replaces the vehicle and road course. "Engine inertia simulation" refers to the reflected inertia and torque that must be applied to the torque converter of a transmission to simulate an engine. In this case, an electric motor replaces the engine. Therefore, the transmission is subjected to the same output loads, input torques, and inertias that would be experienced in a vehicle. As a result of this input and output simulation, it is possible to perform dynamic testing of a transmission without the use of a vehicle or a fuel driven engine input. In the past, true dynamic testing of a transmission with an electric motor was not feasible; the input inertia of the electric motor was too large, thereby causing damage to the transmission during transient events (changing gears); the acceleration and deceleration rates of the electric motor were not fast enough to truly simulate an engine. However, the technology has become available to significantly reduce the inertia of a motor and increase the acceleration and deceleration rates sufficiently to simulate engine performance.

The term "thermal control system" refers to a two part system. The first part is an environmental chamber around the transmission to provide a programmable ambient temperature around the transmission case. The second part is a cooler circuit that simulates the in-vehicle transmission cooler in terms of volume and flow restriction.

The term "transmission attitude" refers to the mounting angle of the transmission, with respect to a horizontal reference plane. It may also include attitude variations in real time over a simulated road course.

The primary goals of the virtual transmission test cell are as follows:

1. Road load and engine simulation;
2. Thermal controls; and
3. Transmission attitude (tilt).

Development, calibration and validation are also important initiatives of the test cell.

Turning to FIG. 1, a schematic illustration is provided of a hardware-in-the-loop test article for an automatic rear wheel drive transmission. In this schematic, an automatic rear wheel drive transmission 10 is installed in the test cell 12. As illustrated, an environmental chamber 14 encloses the transmission 10, and includes means for controlling the ambient temperature and air flow across the transmission 10. Means are also provided for managing heat rejection from the transmission 10 via convection through air flow and by the exchange of heat from transmission oil which flows through the transmission 10. This heat rejection control is represented by reference 16 in FIG. 1.

Input power 18 is also provided to the transmission 10 from an input motor 20. The input motor 20 simulates average torque depending on speed and throttle, firing pulses dependent on speed and throttle, and engine inertia in order to provide accurately simulated input power 18 to the transmission 10.

The transmission 10 is also subjected to an output load 22 via an output motor 24 which simulates vehicle load, road load, and driveline characteristics. The output motor takes the mass inertia of the vehicle and the mass inertia of the rotating components into account. This includes components such as tires, wheels, rotors, axles, differential and drive shaft. These are important when considering acceleration and deceleration or coastdown of the vehicle. In addition, aerodynamic drag of the vehicle is important in providing a good representative model. Aerodynamic drag takes parameters such as vehicle velocity, density of air, frontal area of the vehicle, and coefficient of drag into consideration. The road load or road model considers the grade the vehicle is traveling on, the elevation above mean sea level, and the coefficient of rolling resistance.

Also, a tilt control 26 is provided to adjust the attitude of the transmission 10 to simulate the installed position of the transmission in the vehicle, and/or to simulate transient attitude changes of the transmission on a road schedule.

A transmission controller 28 is also provided in electrical communication with the transmission 10. The transmission controller includes means to control shifting, line pressures, torque management, converter clutch schedules, hot mode protection and shift feel, and also responds to other controllers on the vehicle. The transmission controller may be a transmission control module, such as a production controller, to be used with the transmission 10 in the final vehicle, or a powertrain control module or lab based generic control module used for testing purposes only. If the transmission controller 28 is a transmission control module for use in production, it may also be tested and calibrated in the test cell 12.

The transmission controller 28 facilitates testing of the transmission in various modes of operation, including neutral, garage shift (neutral to reverse, reverse to neutral, neutral to drive and drive to neutral), steady state, acceleration, deceleration or coast-down, and any desired shift schedule in accordance with a predetermined gear shift map.

The neutral mode produces the following conditions: the input motor is in speed mode and running at idle speed—500 to 800 rpm. The output motor is holding zero output speed, provided that the road gradient is exactly zero. If the road gradient is other than zero, there is a positive or negative torque exerted on the transmission. However, the output motor functions as if the brake is applied; therefore, the output motor will exert the appropriate torque to hold the output speed at zero. Input and output speeds and torque data are captured.

The garage shift mode produces the following conditions: the throttle position is zero; the brake position is on; and the input motor is at idle speed. The output motor applies torque (positive or negative as required) to hold zero output speed. Input and output speed and torque data are captured.

The steady state mode produces the following conditions: the input motor is applying a constant torque to the transmission; the output motor is applying a constant load to the transmission. Input and output speed and torque data are captured and compared to calculated data.

The acceleration mode produces the following conditions: the input motor produces torque based on throttle position and speed; and the output motor produces a varying load based on changing speed conditions and a constant vehicle load. The test begins at zero vehicle speed. The throttle is then set to a fixed position; the input motor and the output motor apply loads according to models residing in the appropriate control system. The system accelerates until the available torque to accelerate is exhausted. Input and output speed and torque data are captured and compared to actual vehicle data, calculated data, and other available data.

The deceleration mode produces the following conditions: the input motor is at zero throttle and producing the torque that corresponds to the speed; the output motor produces a varying load based on changing speed conditions and a constant vehicle load. The coast-down test begins at some vehicle speed, such as 80 miles per hour. The system decelerates until the vehicle speed equivalent is about 10 mph. Input and output speed and torque data are captured during the test. The data is compared to actual vehicle data, calculated data, and other available data.

If the transmission controller 28 is implemented as a generic control module, the generic control module will utilize off the shelf micro controller technology and apply it to existing electo-mechanical component interface circuitry to provide a medium fidelity solution. The goals of the generic control module are: to integrate a control system that will improve test accuracy and repeatability, to decrease down time for calibration; to reduce electronic tool design time and costs by making it flexible and modular; and to minimize downtime for test changes.

The generic control module is a medium fidelity solution which will likely only be used until production controllers are integrated into the test cell.

The generic control module (GCM) control strategy incorporates a master/slave configuration. This allows the GCM to maximize the throughput and minimize the complexity of the software. The master is an ADAPT 812 DX board from Technological Arts of Toronto, Ontario, Canada which utilizes a Motorola 68HC812A4 16 bit micro controller with 512 K bites/memory, 512 K bites non-volatile RAM and an external EPAGE. The master is responsible for running the transmission algorithms such as inputs, shift point control, TCC apply/release, hot mode, line pressure control and torque management, as well as storing calibration data.

The eight slaves are ADAPT 11 DP12C24 boards from Technological Arts. Each board uses a Motorola 68HC811E2 8 bit micro controller with 2 K bites of Dual Port RAM mapped to the master's EPAGE. Each slave controller handles a dedicated function within the GCM. Slave board number one is a visual interface which displays variables to be monitored during operation. Sixteen LED indicators are provided for mode and fault information. Slave board number two is a user interface for uploading and downloading calibrations. Slave board number three includes transmission control one, PWM control channels 1–4, on/off solenoid control channels 1–4. Slave board number four provides transmission control 2, PWM control channels 5–8, on/off solenoid control channels 5–8. Slave board number five provides speed inputs in four channels. Slave board number six provides 12 digital to analog outputs. Slave board number seven provides 16 internal and 16 external analog to digital inputs. Slave board number eight provides a dual wire CAN port for future applications.

Turning to FIG. 2, the hardware-in-the-loop test article is schematically illustrated for an automatic front wheel drive transmission. As shown, the front wheel drive transmission 40 is differently configured than the rear wheel drive transmission shown in FIG. 1. The front wheel drive transmission 40 receives input power 42 at an upper portion 44 of the transmission 40, and output power 46, 48 is transmitted at opposing ends of the transmission 40. This configuration results in a challenge to providing the input power 42 to the transmission due to the reduced space available. Accordingly, a different input motor is used for testing front wheel drive transmissions than that used for testing rear wheel drive transmissions. The transverse front wheel drive transmission shown in FIG. 2 therefore differs from the rear wheel drive transmission in that there are multiple outlets 46, 48. Also, cornering effects must be accommodated for because each wheel has a different speed so the outputs may be at different speeds, and attitude simulation is different because a front wheel drive transmission is transversely mounted.

Turning to FIG. 3, a more detailed schematic illustration of a transmission test cell 112 is shown. The test cell 112 includes an environmental chamber 114 having environmental controller 115. The transmission 110 is positioned inside the chamber 114 to control ambient and flow conditions within the chamber 114.

Input power is provided to the transmission 110 through the engine simulation 118. The engine simulation 118 includes the input motor 120 and the drive or input controller 121, a torque meter 123 measures torque output of the input motor 120.

An output load is simulated by the road, vehicle and output driveline simulation 122, which includes the output motor 124 and output drive or output controller 125.

An attitude simulation 126 is provided for adjusting the attitude or angle of the transmission 110 with respect to a horizontal plane. The transmission control module 128 may be a production or prototype transmission control module, a powertrain control module, or a generic control module. Preferably, the transmission controller 128 is a production transmission controller which may be tested and calibrated in the test cell 112.

A transmission cooler simulation 130 is also provided for controlling rejection of heat from transmission oil circulating through the transmission 110.

Each of the above systems is connected to the test automation system (TAS) 132, which controls the test cell 112. The TAS performs the functions of user interface, system management, data collection, supervisory control, and system setup. It includes torque maps, engine maps, vehicle and road schedules, and all other data or programs necessary to run the test. As shown, the TAS is connected to the input drive 121, the output drive 125, the transmission control module 128, the transmission cooler simulation 130, the attitude simulation 126, and the environmental control 115 for controlling the test.

Preferably, the TAS 132 includes a host computer, which comprises four PCs. The four PCs include an ATX Rackmount 4U casing; a 128 Mb SDRAM; ASUS CU4X motherboard with single 800 MHz Pentium III; Ethernet card 3COM 3C905TX-B PCI 10/100; 52X CDROM; floppy drive; 20 Gb hard drive; and FireWire boards. The components are available from DL Custom Ltd. of Markham, Ontario, Canada with separate off the shelf components. The instrumentation includes an APC-8820 PCI 5 IP carrier board; IP 330 A/D; IP 220; IP 470; DC20-PCI timer/counter from Acromag of Wixom, Mich. and ICS Advent of San Diego, Calif. The operating system is a Windows 2000 in two of the PCs and QNX in the other two PCs. The software platform is a Matlab/Simulink; RT-Lab from Mathworks of Natick, Mass. and Opal-RT Technologies of Montreal, Quebec, Canada. The computer hardware includes a network hub and switch 10/10 MB/S 8 ports net gear FS308 from NETGEAR, Inc. of Santa Clara, Calif.

Figure 4:
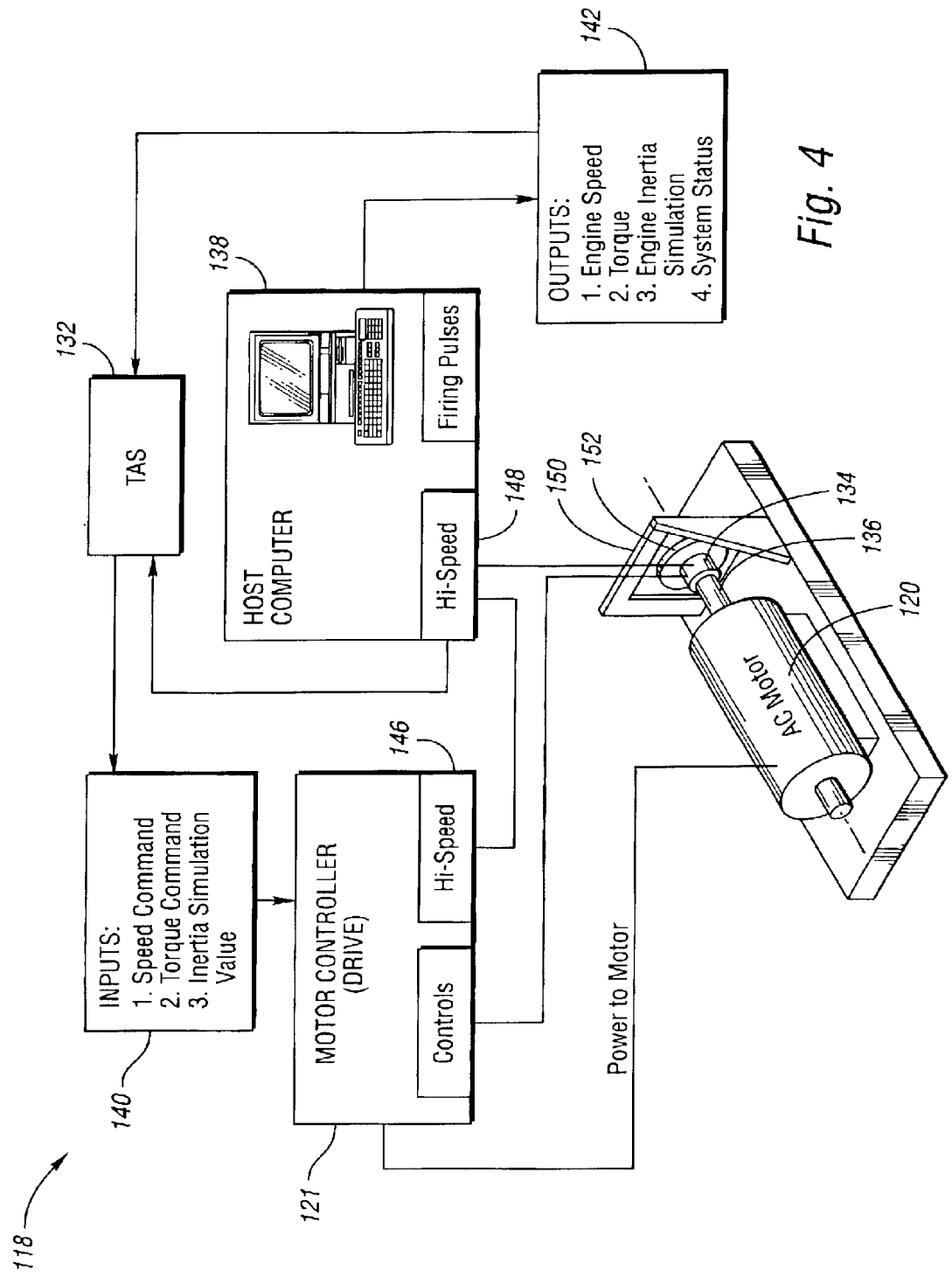
FIG. 4 is a schematic illustration of an engine simulation for use in the test cell of FIG. 3.

Turning to FIG. 4, a schematic illustration of the engine simulation 118 is provided for use with the test cell of FIG. 3. As shown, the engine simulation 118 is based upon a 330 kilowatt, 9000 rpm AC low inertia input motor 120, available from Anderson Electric Controls, Inc. of Kent, Wash. This motor performs to established power curves based on throttle position, speed and torque. Successful performance requires inertia management such that it simulates a vehicle engine at all times, including transient events (i.e., gear shifting). Firing pulses from a V8 engine, for example, include substantial peaks, and are not smooth. Therefore, it is a significant accomplishment to cause the torque of an electric motor to rise and fall in a manner to simulate an engine.

The Anderson Electric motor referenced above is a low inertia motor which is operatively connected to the motor controller 121. The motor has an inertia of 0.12 $kgm^2$ (kilogram*meter^2). The maximum torque is 528 Nm. This inertia is similar to that of a V8 engine. The motor is designed for inclined operation and thrust from the transmission. The motor is designed to keep the natural frequency as high as possible. A torque hub (or torquemeter) 134 is mounted on the motor shaft 136 to monitor drive torque into the transmission. The torque hub 134 is operatively connected to the motor controller 121 and to the host computer 138. An encoder is used to measure the operating speed. Also, thermocouples are mounted in the motor at critical positions to prevent overheating.

Slew rates in excess of 40,000 rpm/second are needed to perform the transient downshifting and firing of pulse simulations.

The motor controller 121 provides the current to operate the motor 120 according to real time commands from the TAS 132 which reads throttle position and speed and sends the motor controller 121 a torque map. The motor 120 then performs like the desired engine in the desired vehicle.

The host computer 138 provides a user interface to perform manual configuration of engine inertia, alarm limits, drive and motor status, and to create static firing pulse wave forms and load static firing pulse wave forms. The TAS 132 monitors motor speed and torque for comparison with driver and vehicle demands and sends appropriate updated commands in real time to the motor controller 121.

This engine simulation 118 is capable of simulating the inertia and power map performance of production engines from small four cylinder engines through V8 engines.

As further shown in FIG. 4, the inputs 140 from the TAS 132 to the motor controller 121 include speed commands, torque commands, and inertia simulation values. The outputs from the host computer 138 to the TAS 132 include engine speed, torque, engine inertia simulation, and system status.

Low fidelity, medium fidelity and high fidelity engine torque simulations are contemplated. In a low fidelity simulation, the input motor produces 528 Nm torque to 5965 rpm. The low fidelity solution will only specify an average torque which must be below the above torque; Medium and high fidelity solutions may require torque peaks more than two times the average for a short time period (milliseconds). The motor must satisfy this range of torque requirements. This simulates all front wheel drive engines, and some rear wheel drive engines. A higher horse powered motor would be needed for larger rear wheel drive engines.

Available dynamometer data is used in low fidelity tests wherein throttle percentage and engine rpms are referenced in a look-up table to provide torque commands. Adjustments must be made for accessory loads, such as power steering pumps, air conditioning, cooling fans, etc. Also, effects of spark advance or exhaust systems could be added. Because no accessory loads are incorporated in the look-up tables, maximum input power is applied in to the transmission. Correlation to the vehicle will require that engine accessory loads are modeled and correlated to vehicle usage. The engine control module includes tables for spark advance and other commands that have a significant effect on engine power. These can be modeled as well. Because the data points represent a steady state, dynamic testing is a challenge. Using data from steady state testing means the rate of change between points is unknown. Managing the transient accelerations is very important because the input motor can accelerate at 967 rpm/$second^2$ compared to 54 rev/$second^2$ (this is a highly averaged response rate; this is not firing pulse response rate) for a 5.3 liter V8 engine, for example. Also, the available dynamometer test data does not include an inertia term, so inertia must be handled externally from the data.

In this mode, the engine profile is loaded into the test cell software and the input motor operates using the 3-dimensional lookup table of available information. In addition, the engine's inertial values as well as the inertia for shifting system are described. An accurate inertia torque simulation can be reproduced. The test schedule will contain throttle position, control states for forced motors, PWM devices, solenoids and PRNDL position.

Torsionals provide a medium fidelity firing pulse simulation. In this simulation, a sine wave is split into two parts: 1) the compression ratio; and 2) the power ratio. A multiplier is used for each to simulate a firing pulse. The engine torsionals must be below the maximum or break-down power of the input motor. This input motor can produce a maximum of 1250 Nm in short transient periods of operation to 5965 rpm.

Achieving high fidelity engine torque simulations requires tuning the input motor drive shaft to the simulated engine's natural frequency and torsional compliance. It is good to have an input motor with a higher natural frequency than the engine because the natural frequency can be readily adjusted down.

The input motor is also designed with the capacity for extremely high accelerations so that a high fidelity crank torque can be simulated.

The engine simulation or input motor system must simultaneously control speed, torque and simulate inertia as the engine accelerates and decelerates. This is a complex control task requiring a minimum of two or more control groups and fast input and output signals to meet simulation requirements. Accordingly, the high speed communications 146, 148 are provided, and values are updated every 5 milliseconds. The control groups operate from math based models and compare or error check to the model and hardware or unit under test.

It is important to understand that this motor must not only act like an engine, but also react like one. This includes torque, speed and inertia torque characteristics of the engine. The engine inertia is governed primarily by its architecture and is mechanical in nature, but the input motor has to electrically reproduce this inertia. Without accurate reproduction of this inertia, catastrophic internal transmission failure will accrue. In most step ratio transmissions, one or more friction elements are required to change gear states. For a moment between gear states, friction elements are slipping. At this moment if the inertia torque of the input motor is too great and the shift takes too long to complete, damage will occur to the transmission. Simulating this is made even more difficult because the motors have mechanical properties and the mechanical inertia of the shafting and couplers between the motor and transmission. These have to be electrically managed by the input motor for engine simulation. The engine simulation is achieved using different methodologies depending on the available data at the time of testing.

As further shown in FIG. 4, a transmission mounting plate 150 operates as an interface to which the transmission is bolted and through which the shaft 136 of the motor 120 extends. A flex plate 152 is also provided.

The input drive or input motor controller 121 is preferably a model PN1137400-01 from Anderson Electric Controls, Inc. of Kent, Wash., and is a 480 VAC, 330 kW, 800 amp PWM converter with a closed loop flux vector voltage inverter motor drive.

Figure 5:
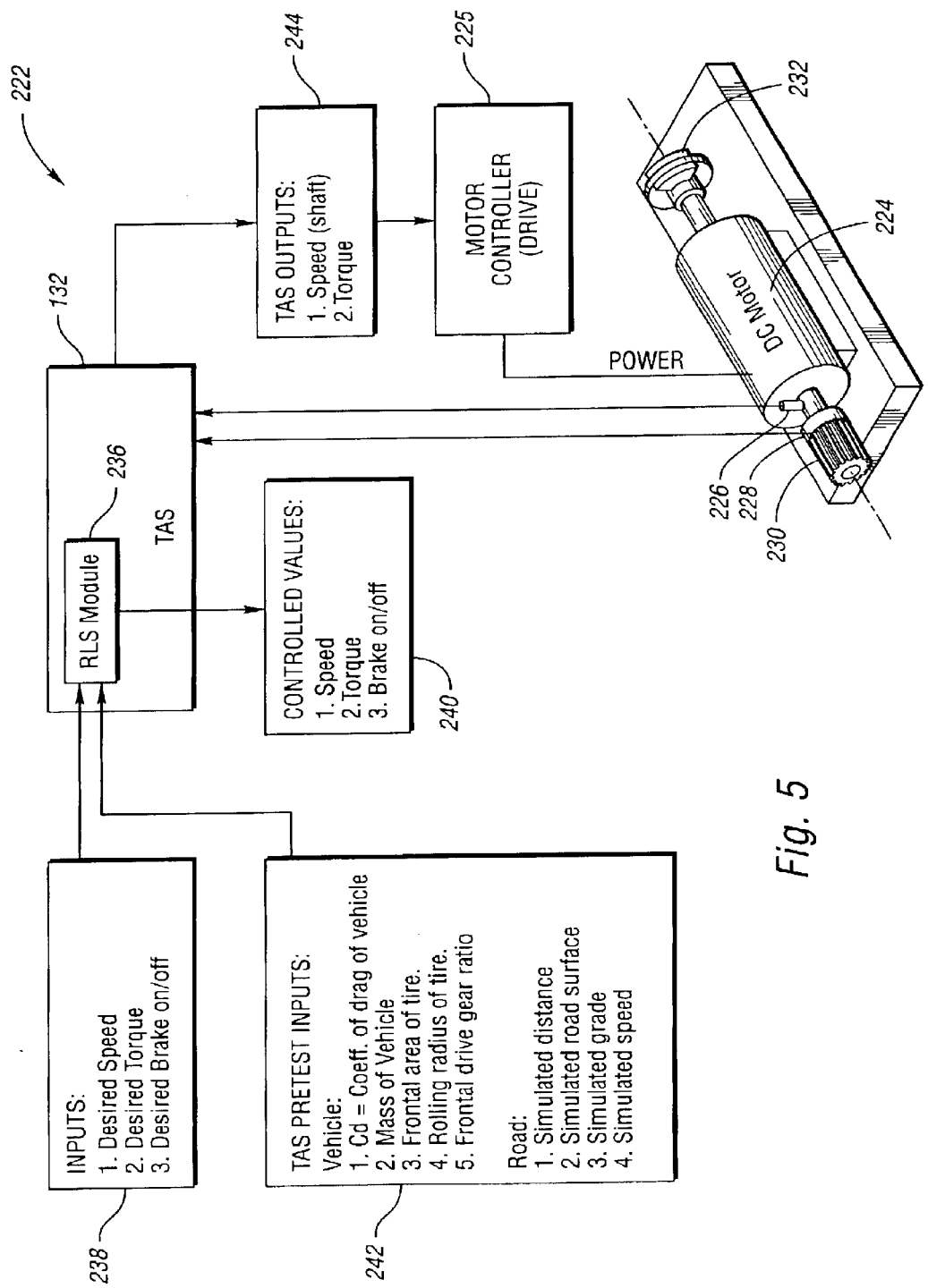
FIG. 5 is a schematic illustration of vehicle, road and output driveline simulation for a rear wheel drive vehicle for use in the test cell of FIG. 3.

Turning to FIG. 5, a vehicle, road and output driveline simulation 222 is shown for a rear wheel drive vehicle for use in the test cell of FIG. 3. The vehicle, road and output driveline simulation 222 is based upon the output motor 224 and motor controller 225. The output motor 224 is preferably model SN1S14B4847 from Westinghouse, Inc. of Round Rock, Tex. and is a 400 hp, 4500 rpm DC motoring dynamometer. The motor controller 225 is preferably a model SN724990-8305-01 from Southern Industrial Controls of Mobile, Ala. and is a 500 hp, DC-12 dc motor drive.

The output motor 224 includes a speed sensor 226 for sensing rotational speed and sending signals to the TAS 132. A torque meter 228 similarly senses torque and sends signals to the TAS 132. A speed reduction gear box 230 is also provided. The speed reduction gear box 230 is preferably a model SN30983 from Turbodyne of Carpinteria, Calif. and is an 1800 hp, 1.741:1, 8500 rpm gear box. A brake 232 is also provided on the motor 224 to hold zero speed when needed.

As shown in FIG. 5, the TAS 132 includes a road load simulation module 236. The inputs 238 to the road load simulation module include desired speed, desired torque, and desired brake on/off condition. The controlled values 240 of the road load simulation module, accordingly, include speed, torque and brake on/off condition.

The pretest inputs 242 to the TAS 132 related to the vehicle include the vehicle's coefficient of drag, the vehicle mass, the frontal area of the tires, the rolling radius of the tires, and the final drive gear ratio. The TAS pretest inputs 242 related to the road include simulated distance, simulated road surface, simulated grade, and simulated speed. The TAS outputs 244, or dynamometer set points, include speed and torque of the drive shaft. These outputs are sent to the motor controller 225.

The vehicle, road and output driveline simulation 222 of FIG. 5 may also be readily modified for simulation of a 4-wheel drive vehicle.

Figure 6:
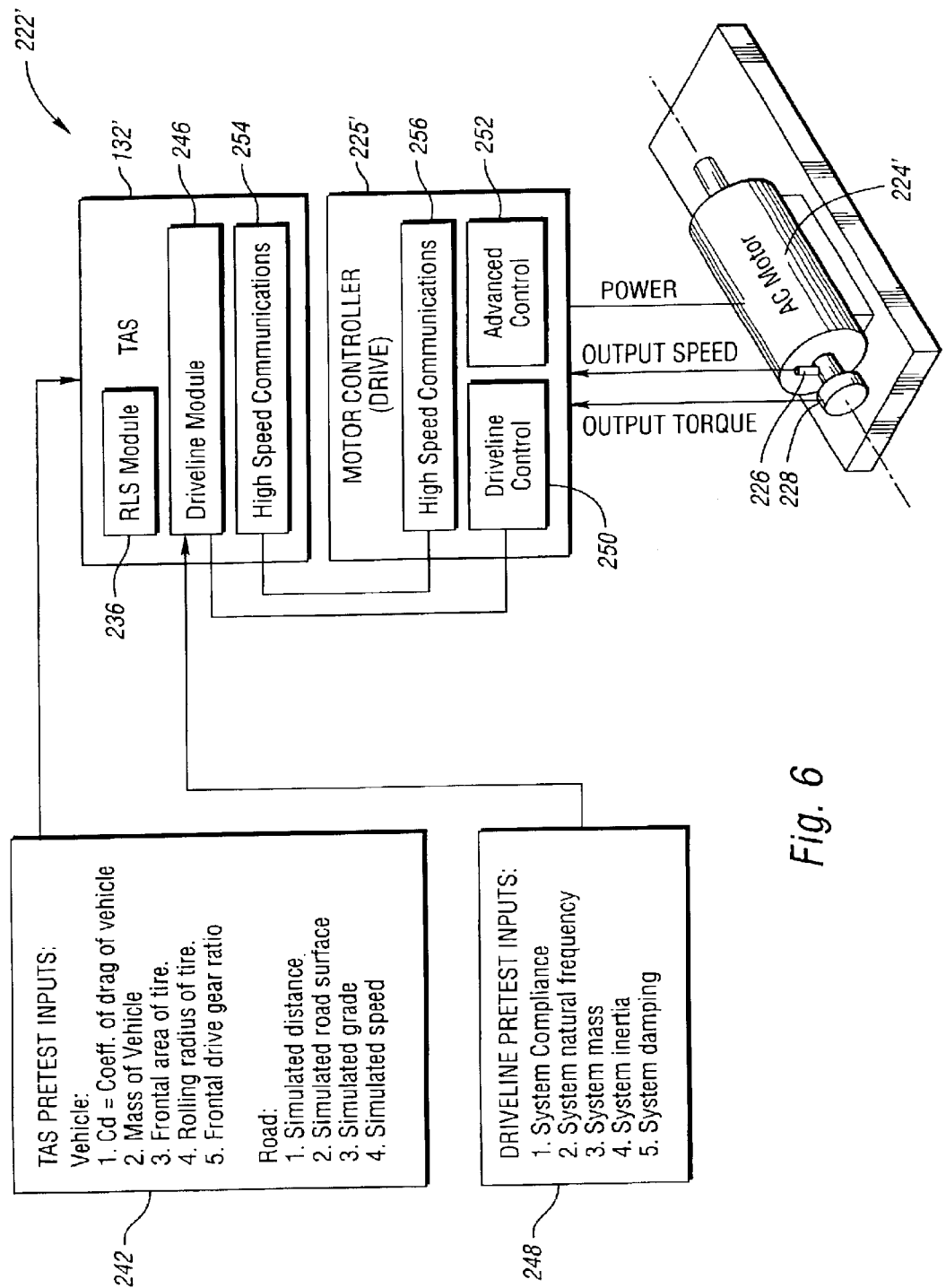
FIG. 6 is a schematic illustration of a vehicle, road and output driveline simulation for a rear wheel drive vehicle for use with the test cell of FIG. 3, wherein the controller provides advanced driveline simulation.

Referring to FIG. 6, an alternative vehicle, road and output driveline simulation 222' is shown for a rear wheel drive vehicle for use in the test cell of FIG. 3. This simulation 222' is a modification of the simulation 222 shown in FIG. 5. In FIG. 6, like reference numerals are used to describe like components from FIG. 5. As shown, the simulation 222' includes the TAS 132' which receives the same pretest inputs 242 as described in FIG. 5. The pretest inputs 242 related to the vehicle include coefficient of drag, vehicle mass, frontal area of tires, rolling radius of tires, and final drive gear ratio. The pretest inputs related to the road include simulated distance, simulated road surface, simulated grade and simulated speed. The simulation 222' of FIG. 6 differs from that of FIG. 5 in that the TAS 132' includes the driveline module 246 which receives the pretest driveline inputs 248, including system compliance, system natural frequency, system mass, system inertia, and system damping. The driveline module 246 communicates with the driveline control 250 in the motor controller 225'. The advanced control 252 provides the driveline simulation command signals to be sent to the output motor 224' which is a high performance AC motor. Two such motors are required for front wheel drive applications. Also, high speed communications 254, 256 are provided for communicating between the TAS 132' and motor controller 225' in a manner to facilitate the advanced control.

The output motor 224' also includes the speed sensor 226 and torque meter 228 for sending feedback torque and speed signals to the motor controller 225'.

Figure 7:
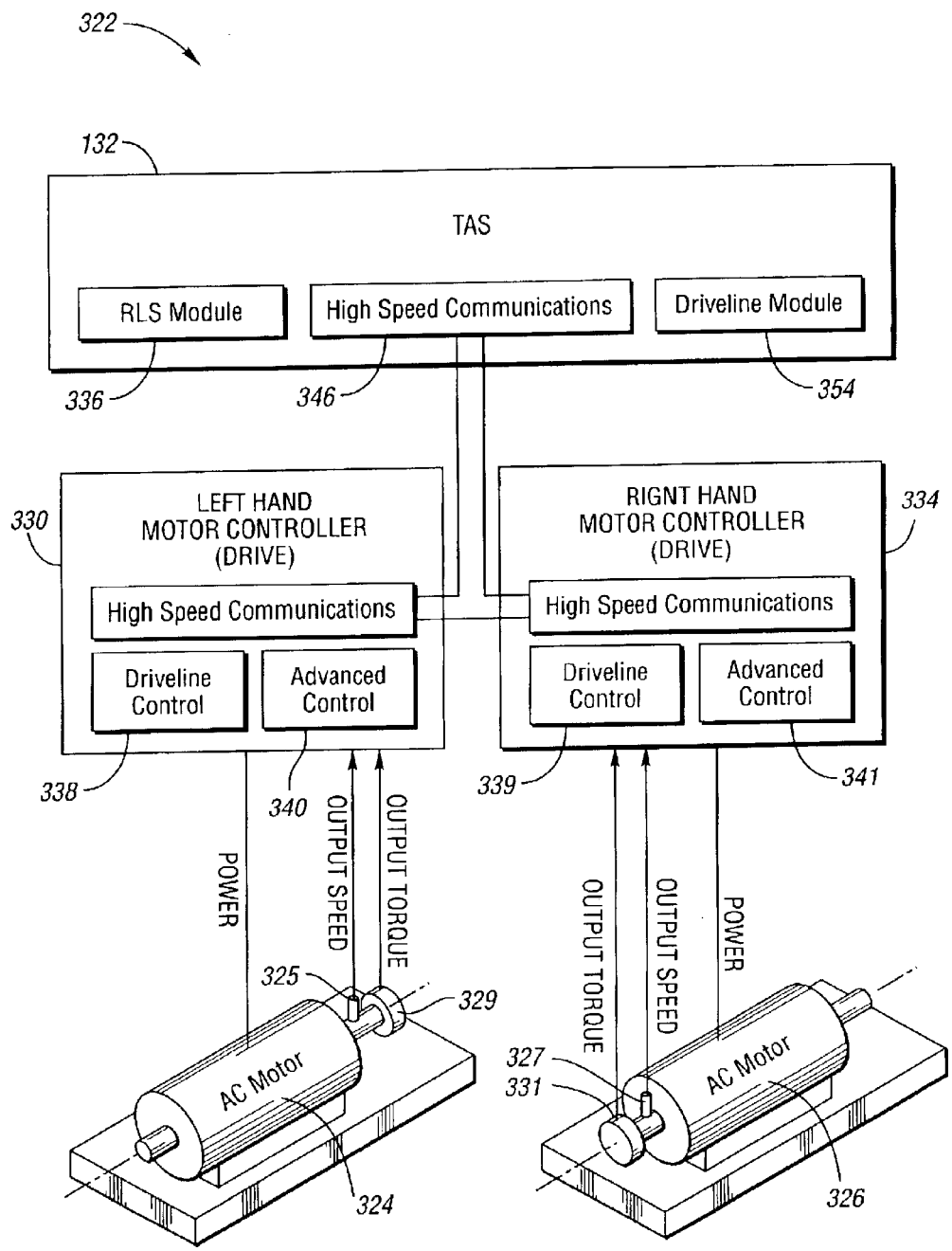
FIG. 7 is a schematic illustration of a vehicle, road and output driveline simulation for a front wheel drive vehicle for use with the test cell of FIG. 3.

Turning to FIG. 7, a vehicle, road and output driveline simulation 322 is shown for a front wheel drive vehicle for use in the test cell of FIG. 3. As shown, in this simulation, the test automation system (TAS) 132 includes the road load simulation module 336, the driveline module 346, and a means for high speed communication 354. Because the front wheel drive transmission has two outputs (as shown in FIG. 2), two output motors 324, 326 are implemented in the simulation 322. The motors 324, 326 are AC motors which each include a speed sensor 325, 327, and a torque meter 329, 331 for sending output speed and output torque signals back to the respective left hand motor controller 330 and right hand motor controller 334. This system is adaptable for AWD or 4WD configurations as well.

As shown, the right hand and left hand motor controllers 330, 334 each include a driveline control 338, 339 and an advanced control 340, 341, as described previously with reference to FIG. 6.

The left hand and right hand motor controllers 330, 334 provide power signals to the AC motors 324, 326 to generate the appropriate speed and torque to simulate vehicle, road and driveline load.

The right and left hand controller functions may be provided by a single dynamometer controller which reads values in real time and calculates current set points for the output motors. The use of look-up tables in the dynamometer may simplify the process with the aid of high response communications between the components. Preferably, the output motors must be able to react to a given set point at a rate up to 50 Hz. The controller(s) must also be able to calculate the given road load and convert to a current set point instantaneously. The driveline controls 338, 339 take into effect the inertia and other driveline characteristics which affect response times and torsional response of the various systems.

Road load simulation has been successfully implemented in various industries and is a common mode of operation provided by most system integration/dynamometer suppliers. The applications in powertrain are usually limited to test labs with gas firing engines, which simplifies the process, as the objective is a better focus on the true road responses. Road load equations, such as commonly known SAE equation J2264, are loaded into most dynamometer controllers, and calculate the required loading (motor torque) required at any given time.

Figure 8:
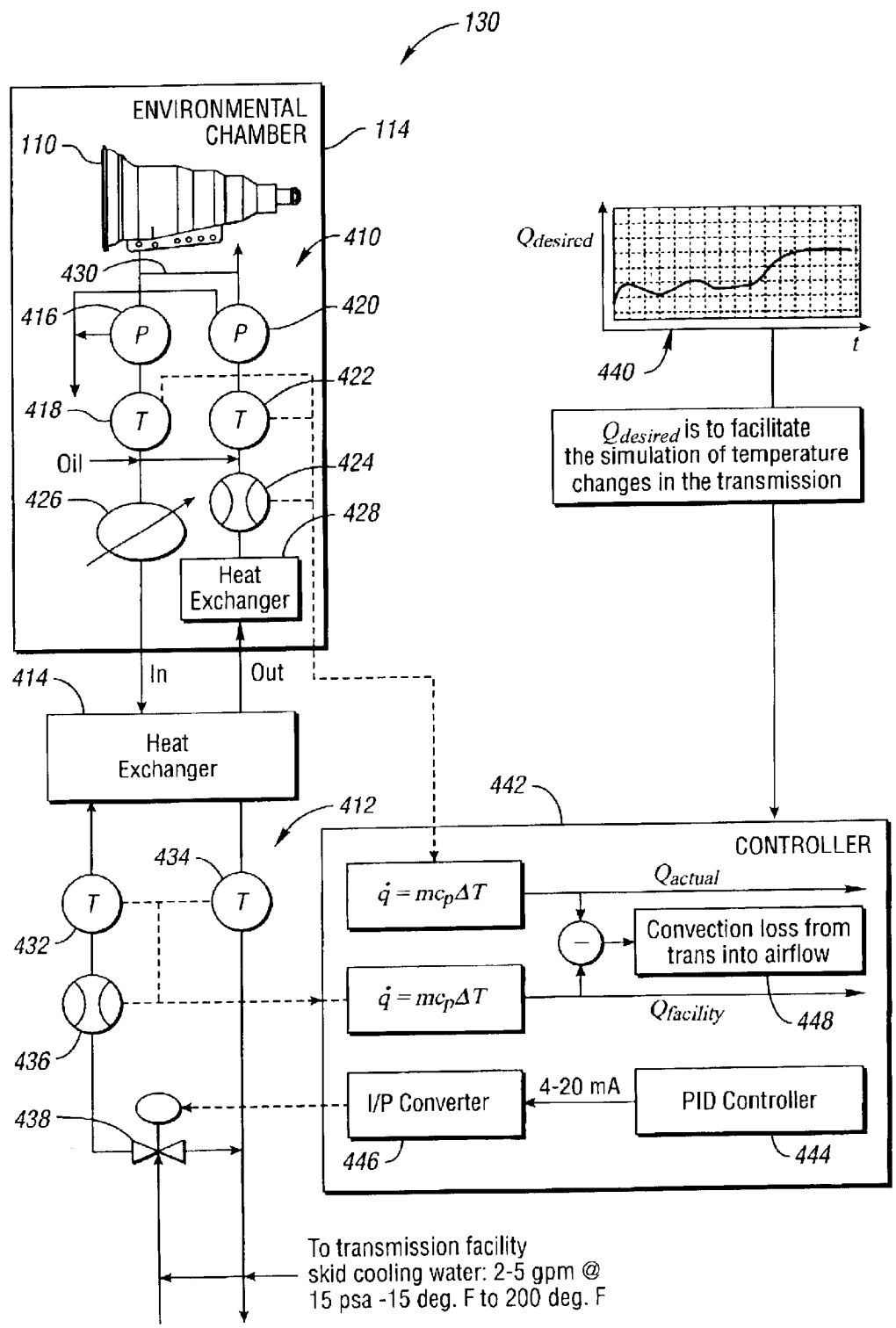
FIG. 8 is a schematic illustration of a transmission oil cooling simulation for use with the test cell of FIG. 3.

Referring to FIG. 8, a transmission oil cooling simulator 130 is shown for use with the test cell of FIG. 3. As shown, the transmission 110 is positioned within the environmental chamber 115, and a primary cooling loop 410 carries hot oil away from, and cool oil to, the transmission 110 for cooling. The primary cooling loop 410 interfaces with the secondary cooling loop 412 (a cooling water loop) at the first heat exchanger 414. The primary cooling loop 410 includes outbound pressure and temperature sensors 416, 418, inbound pressure and temperature sensors 420, 422, a flow meter 424, a variable orifice valve 426, and a second heat exchanger 428. A shunt 430 is also provided between the inbound and outbound transmission fluid lines to selectively bypass the primary cooling loop 410. The variable orifice valve 426 is preferably a model N1600S, available from Parker Hydraulics of Cleveland, Ohio. The orifice valve is a 1" NPT steel Colorflow needle valve.

The first heat exchanger 414 is preferably a model WP1-14, which is a 0.5 liter brazed plate heat exchanger, available from Southwest Thermal Technology, Inc. of Thousand Oaks, Calif. The heat exchanger 414 may be a commercial, industrial or production heat exchanger.

The secondary cooling loop 412 includes inbound and outbound water temperature sensors 432, 434, a flow meter 436, and a diverter/proportioning valve 438 in communication with a water inlet. The diverter/proportioning valve 438 is preferably a model PV38-B, which is a 12 GPM ⅜ inch electronically controlled proportioning valve available from Omega Engineering, Inc. of Stamford, Conn.

As shown, a desired heat rejection profile 440 is provided to the transmission oil cooling controller 442, and the controller 442 is connected (via the dashed lines) to each of the pressure sensors, temperature sensors, flow meters, and diverter/proportioning valve of the primary and secondary cooling loops 410, 412.

As shown schematically in the controller box 442, the relationship $q = mc_p \Delta T$ is used to compare the actual transmission oil conditions in the primary loop 410 with the actual conditions of the water in the secondary cooling loop 412, and an adjustment is provided to track the desired heat rejection profile 440. A PID controller and I/P converter 444, 446 are used to control the diverter valve 438 to control temperature in the secondary cooling loop 412, and thereby control temperature of the transmission fluid in the primary cooling loop 410. The controller 442 also accommodates for convection loss 448 from the transmission into air flowing across the transmission case.

As shown, the primary cooling loop 410 may be positioned inside the environmental chamber 114, by way of example. Alternatively, it may be outside the environmental chamber 114.

Figure 9:
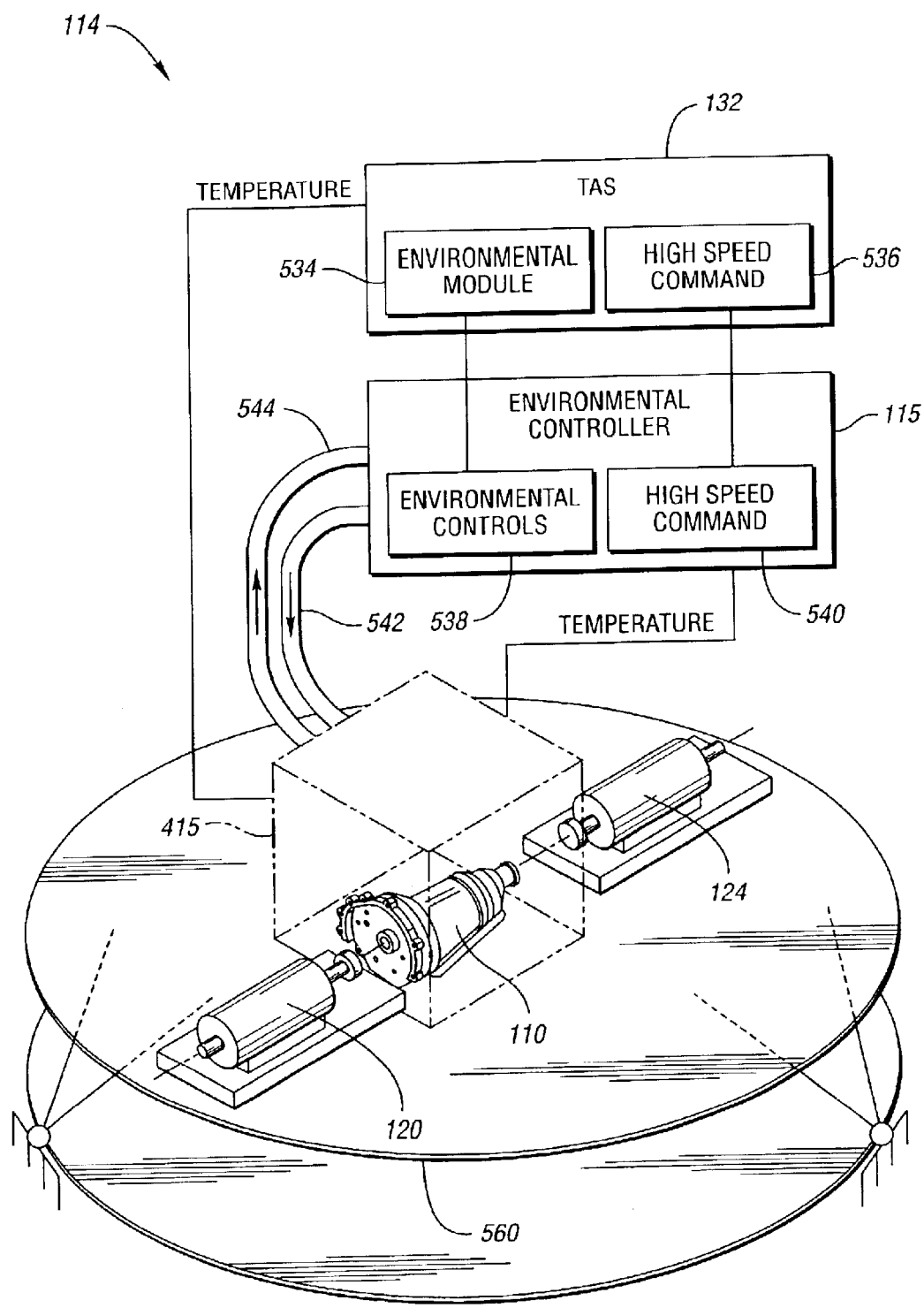
FIG. 9 is a schematic illustration of an environmental simulation for use with the test cell of FIG. 3.

Turning to FIG. 9, an environmental simulation 114 is shown schematically for controlling the ambient conditions within the environmental chamber 115, for use with the test cell of FIG. 3. As shown, the TAS 132 includes an environmental module 534 and a high speed command 536 which communicate with the environmental controls 538 and high speed command 540, respectively, of the environmental controller 115. The air handling equipment within the environmental controller 115 preferably includes model 30HP-RUM-ECA-WC, which is a 30 HP refrigeration, 36 KW heater air temperature control unit, available from Envirotronics of Grand Rapids, Mich. Supply and return air conduits 542, 544 communicate the environmental controller 115 with the environmental chamber 415. The environmental chamber 415 is preferably a 5'W×4'L×6'H thermal enclosure available from McGill Air Pressure Corporation of Westerville, Ohio.

FIG. 9 also illustrates the main platform 560, which is preferably a 10 ft×by 25 ft metal platform which supports the input motor 120 and output motor 124, as well as the transmission 110 and environmental chamber 415.

Controlling the environmental ambient conditions surrounding the transmission is important. Pressure and temperature are monitored within the environmental chamber 415, and these signals are provided to the environmental controller 115. The environmental controller 115 receives desired temperature commands which are input locally or received from the TAS 132, and generates temperature command signals to control the air handling equipment. Inlet temperature to the environmental chamber is also monitored. The inlet air flow is directed across the bottom of the oil pan of the transmission to properly simulate in-vehicle conditions of the transmission. The average volumetric air flow through the chamber is converted to mass flow by calculating air density in the thermal chamber based on temperature and pressure measurements. Subzero environmental temperatures may be provided by encapsulating the environmental chamber 415, and extreme high temperature conditions may also be simulated.

Figure 10:
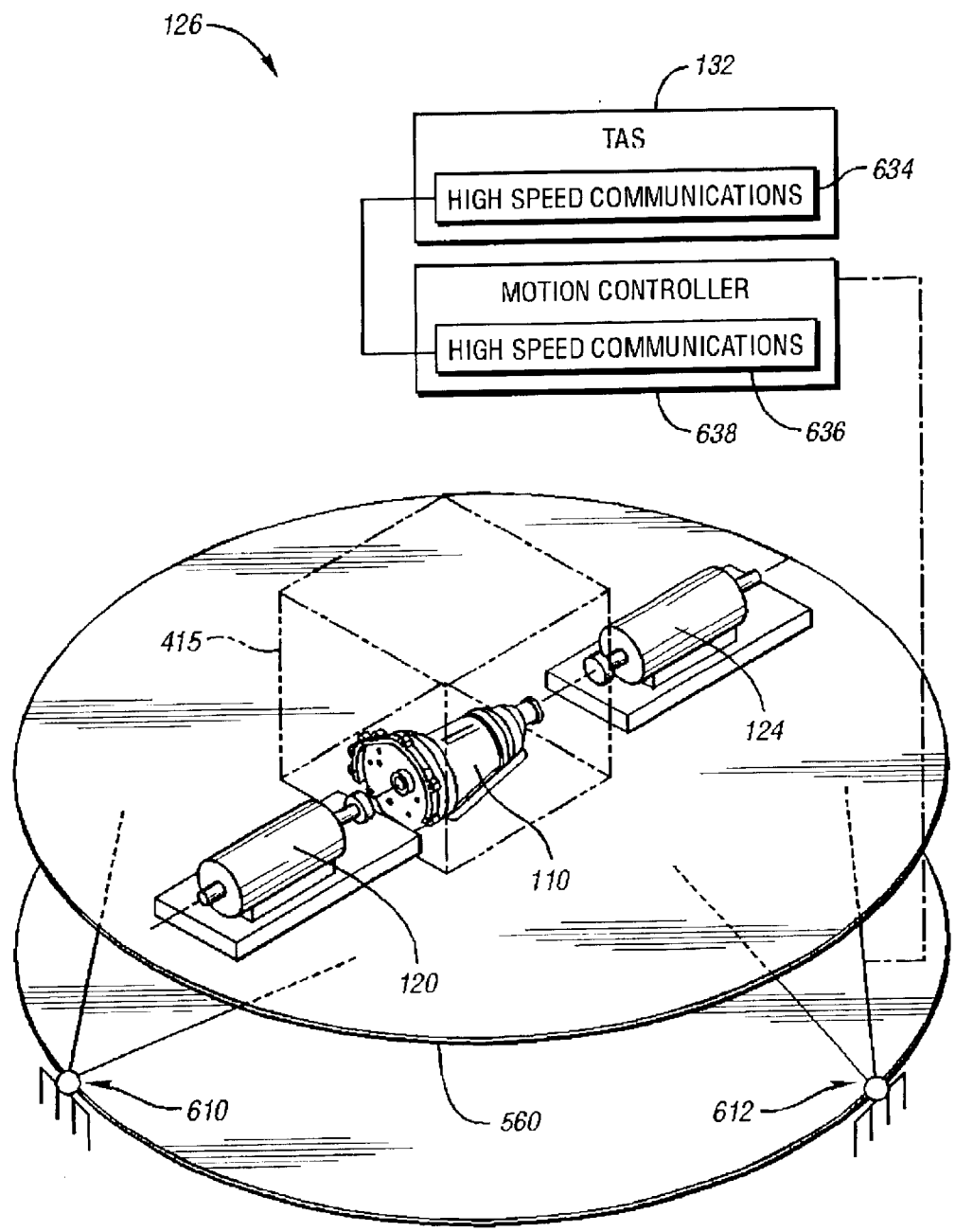
FIG. 10 is a schematic illustration of an attitude simulation for use with the test cell of FIG. 3.

Turning to FIG. 10, attitude simulation for use with the test cell of FIG. 3 is schematically illustrated. As shown, the transmission 110, input motor 120, output motor 124, and environmental chamber 415 are supported on the main platform 560, which is a motion control platform. Specifically, the platform 560 is a hexapod with six degrees of freedom in movement. Two actuators 610, 612 are illustrated to schematically adjust the motion control platform 560 with respect to ground. However, six such actuators may be preferably implemented on the platform 560. Preferably, the actuators 610, 612 are hydraulic cylinders, such as model DAT 64-31-136, which is a 136" stroke double acting cylinder with 49" collapsed length, available from Custom Hoists, Inc. of Hayesville, Ohio. These cylinders and hydraulics are specific to the current site. Using a motion control platform will require an entirely different platform, controls and hydraulics. A hydraulic power unit is also provided, such as a model PNE4G4, which is a 15 HP, 8.6 gpm, 2000 psi, 40 gallon power unit available from Womack Machine Supply of Dallas, Tex. A hydraulic control valve is also provided, such as a model RD2555T4ESA1/6X844, which is a four-way single spool valve, 3000 psi, 16 gpm, available from Prince Hydraulics of North Sioux City, S.Dak.

As shown, the TAS 132 includes high speed communication means 634 to communicate with high speed communication means 636 of the motion controller 638. The motion controller 638 outputs hydraulic power to the actuators 610, 612.

Accordingly, the attitude simulation 126 simulates installation angle of the transmission in the vehicle, grade in forward and reverse directions, cornering, and real time responses on a road course. In this manner, a close approximation of actual transmission driving conditions is provided.

Figure 11:
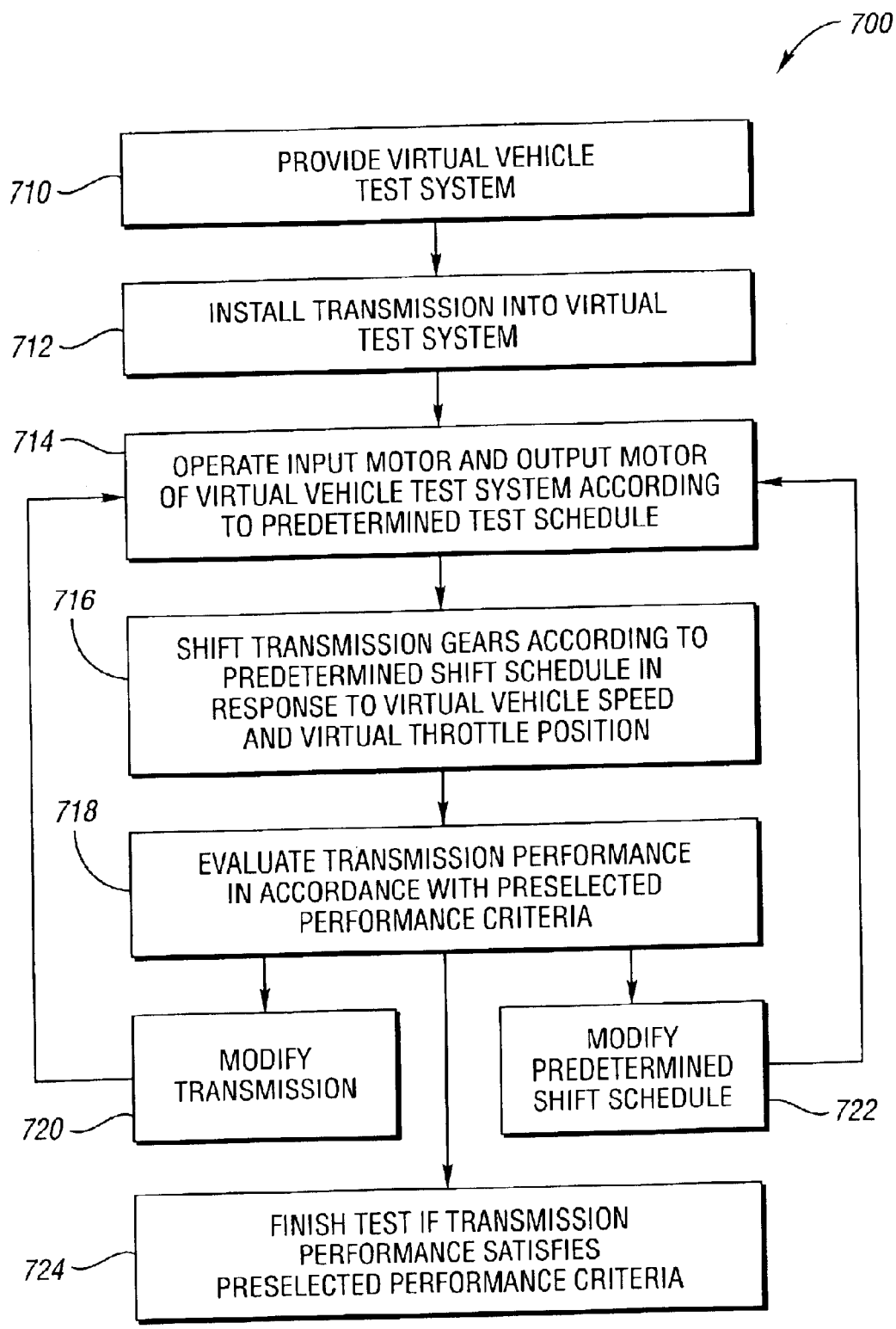
FIG. 11 is a schematic flow chart of a virtual transmission testing method in accordance with the invention.

Referring to FIG. 11, a method 700 is shown for virtual vehicle testing of an automotive transmission according to a pre-determined test schedule which avoids having to install and drive the transmission in a vehicle to perform the testing. The method 700 includes providing a virtual vehicle test system 710 as described previously with reference to FIGS. 1–10. The virtual vehicle test system includes an input motor operatively connectable to an input of the transmission for providing rotational drive thereto and an output motor operatively connectable to an output of the transmission for providing rotational resistance. An environmental chamber is provided for substantially enclosing the transmission. Means are provided for selectively controlling the ambient temperature, pressure, and/or humidity within the environmental chamber. Means are provided for selectively controlling the rate/amount of heat rejected by the transmission, including means for selectively controlling the temperature differential between a supply of transmission fluid to the transmission and a return of transmission fluid from the transmission, and/or means for selectively controlling the flow rate of at least the supply of transmission fluid to the transmission. Also, means are provided for selectively controlling the angular articulation of the transmission with respect to its roll, pitch, and/or yaw axes in simulation of the predetermined test schedule. Means are also provided for selectively controlling the rotational drive of the input motor to selectively simulate the speed, acceleration, torque, inertia and/or other aspects of an engine according to selected speed, throttle position, torque mapping and/or other parameters in simulation of the predetermined test schedule. Means are also provided for selectively controlling the rotational resistance of the output motor to selectively simulate the speed, deceleration, torque, inertia and/or other aspects of an after-transmission drive train of a selected front wheel drive, rear wheel drive and/or all wheel drive vehicle according to selected vehicle aerodynamics, vehicle mass, road condition, air/weather conditions, load carrying, torque mapping and/or other parameters in simulation of the predetermined test schedule. A plurality of speed, torque, temperature, pressure, position, flow rate and/or other sensors are operatively arranged to detect various speeds, torques, temperatures, pressures, positions, flow rates, and the like at selected points in the system. Means are also provided for selectively controlling the shifting of the transmission in response to virtual vehicle speed and virtual throttle position according to a predetermined shift schedule.

The method 700 further includes installing a transmission into the virtual vehicle test system (step 712), such that the input and output of the transmission are operatively connected to the input motor and output motor, respectively. The method 700 further includes operating the input motor (step 714) through the means for selectively controlling the rotational drive thereof to simulate a selected engine according to the predetermined test schedule, and operating the output motor through the means for selectively controlling the rotational resistance thereof to simulate a selected vehicle and selected vehicle affecting conditions according to the predetermined test schedule. The method further includes permitting the transmission to shift among its various gears (step 716) according to the predetermined shift schedule in response to the virtual vehicle speed and virtual throttle position. The performance of the transmission is then evaluated (step 718) in its execution of step 716 in accordance with pre-selected performance criteria. The transmission may then be modified (step 720), or the predetermined shift schedule may be modified (step 722) if the test is not finished. The test is finished (step 724) if the transmission performance substantially meets the pre-selected performance criteria.

Figure 12:
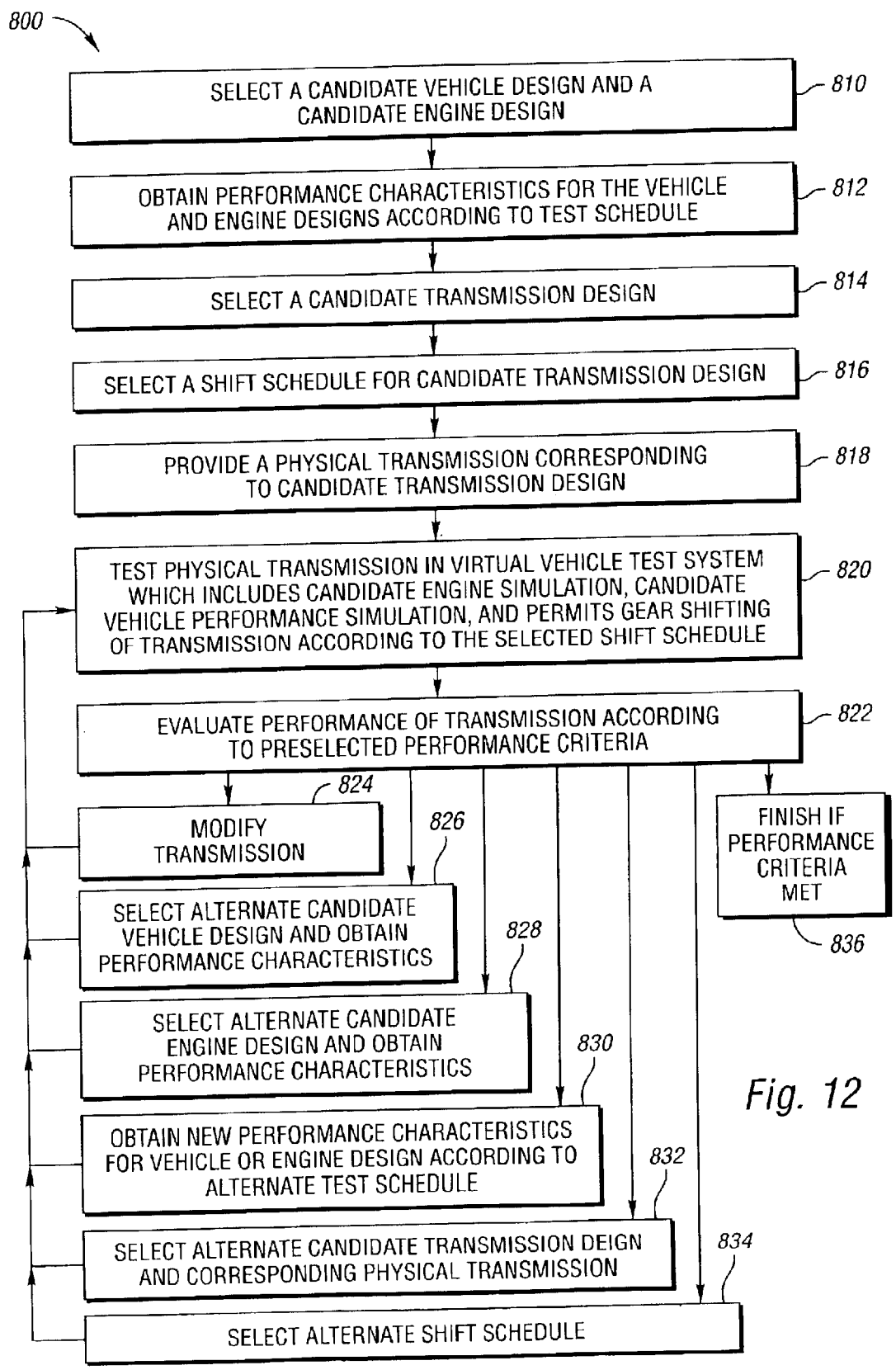
FIG. 12 is a schematic flow chart of a transmission selection method in accordance with the invention.

Turning to FIG. 12, a process 800 is shown for optimally matching candidate vehicle and engine designs with candidate transmission designs which avoids having to install and drive a corresponding physical transmission in a corresponding physical vehicle having a corresponding physical engine. The process 800 includes selecting (step 810) a candidate vehicle design and candidate engine design. Respective performance characteristics are obtained (step 812) for the candidate vehicle and engine designs according to at least one base line test schedule. A candidate transmission design is then selected (step 814), and a shift schedule for the candidate transmission design is selected (step 816). A physical transmission is then provided corresponding to the candidate transmission design (step 818). The physical transmission is then tested (step 820) in a virtual vehicle test system which provides rotational drive to the input of the transmission in simulation of the performance characteristics of the candidate engine, and rotational resistance to the output of the transmission in simulation of the performance characteristics of the candidate vehicle, while permitting the physical transmission to shift among its various gears according to the selected shift schedule in response to virtual vehicle speed and virtual throttle position.

The performance of the physical transmission is then evaluated (step 822) according to pre-selected performance criteria. After evaluation, the transmission may be modified (step 824), an alternate candidate vehicle design may be selected and performance characteristics obtained therefore (step 826), an alternate candidate vehicle design may be selected and performance characteristics obtained therefor (step 828). Further, new performance characteristics may be obtained for a vehicle or engine design according to an alternate test schedule (step 830), an alternate candidate transmission design and corresponding physical transmission may be selected (step 832), or an alternate shift schedule may be selected (step 834). The test is finished (step 836) if the performance criteria are met.

While the best modes for carrying out the invention have been described in detail, those familiar with the art to which this invention relates will recognize various alternative designs and embodiments from practicing the invention within the scope of the appended claims.

What is claimed is:

1. A system for testing an automotive transmission according to a predetermined test schedule which avoids having to install and drive the transmission in a vehicle to perform the testing, the system comprising:

an input motor operatively connectable to an input of the transmission for providing rational drive thereto in simulation of the predetermined test schedule;

an output motor operatively connectable to an output of the transmission for providing rational resistance thereto in simulation of the predetermined test schedule;

an environmental chamber for substantially enclosing the transmission;

an environment controller for controlling the ambient conditions within said environmental chamber; and a transmission cooler for controlling the rejection of heat from the transmission;

wherein the predetermined test schedule includes gear shifting of the transmission between a plurality of speed ratios.

2. The system of claim 1, further comprising an apparatus for adjusting angular articulation of the transmission.

3. A system according to claim 1, further comprising:

an input motor controller for controlling rotational drive of said input motor to selectively simulate the speed, acceleration, torque, inertia and/or other performance aspects of an engine according to selected speed, throttle position, torque mapping and/or other parameters; and an output motor controller for selectively controlling the rotational resistance of said output motor to selectively simulate the speed, deceleration, torque, inertia and/or other performance aspects of an after-transmission drivetrain of a selected vehicle according to selected vehicle aerodynamics, vehicle mass, road conditions, air/weather conditions, load-carrying, torque mapping and/or other parameters.

4. A system according to claim 3, further comprising a plurality of speed, torque, temperature, pressure, position, flow rate, humidity and/or other sensors operatively arranged to detect various speeds, torques, temperatures, pressures, positions, flow rates, humidities and/or the like at selected points in said system.

5. A system according to claim 3, wherein said after transmission drivetrain includes one or more of a drive shaft, a differential unit, a power take-off unit, and a set of wheels.

6. A system according to claim 1, wherein said transmission cooler includes:

means for selectively controlling the temperature differential between a supply of transmission fluid to the transmission and a return of transmission fluid from the transmission; and/or means for selectively controlling the flow rate of at least said supply of transmission fluid to the transmission.

7. A system according to claim 6, wherein said means for selectively controlling the temperature differential includes a first heat exchanger connected to said supply and return of transmission fluid, wherein said first heat exchanger is situated outside of said environmental chamber.

8. A system according to claim 6, wherein said means for selectively controlling the flow rate includes a variable orifice valve.

9. A system according to claim 7, further comprising:

a shunt between said supply and return of transmission fluid, wherein said shunt is situated inside of said environmental chamber; and a second heat exchanger operatively connected with the first heat exchanger to enhance cooling capacity.

10. A system according to claim 1, further comprising:

a ratio-changing gear box operably connected to said output motor and operably connectable to the output of the transmission.

11. A system according to claim 1, further comprising:

a transmission controller for selectively controlling the gear shifting of the transmission in response to virtual vehicle speed and virtual throttle position according to a predetermined shift schedule.

12. A system according to claim 3, further comprising a test automation system controller (TAS) operatively connected with the input motor controller, the output motor controller, the environmental controller and the transmission cooler for controlling testing of the transmission.

13. A system according to claim 3, further comprising an input torquemeter operatively connected to the input motor and the input motor controller, and an output torquemeter operatively connected to the output motor and the output motor controller.

14. A system according to claim 2, wherein said apparatus for adjusting angular articulation comprises a platform supported by a plurality of hydraulically adjustable supports.

15. A system according to claim 1, wherein said input motor is an electric motor with an inertia simulation capability between approximately 0.05 and 0.25 $kgm^2$.

16. A system according to claim 15, wherein said input motor is a 330 kw, 9000 rpm AC motor.

17. A system according to claim 16, wherein inertia of the input motor is approximately 0.12 $kgm^2$ in order to simulate a V8 engine.

18. A system for testing an automotive transmission according to a predetermined test schedule which avoids having to install and drive the transmission in a vehicle to perform said testing, comprising:

a. an input motor operatively connectable to an input of the transmission for providing rotational drive thereto;

b. an output motor operatively connectable to an output of the transmission for providing rotational resistance thereto;

c. an environmental chamber for substantially enclosing the transmission;

d. means for selectively controlling the ambient temperature, pressure, and/or humidity within said environmental chamber;

e. means for selectively controlling the rate/amount of heat rejected by the transmission, including means for selectively controlling the temperature differential between a supply of transmission fluid to the transmission and a return of transmission fluid from the transmission, and/or means for selectively controlling the flow rate of at least said supply of transmission fluid to the transmission;

f. means for selectively controlling the angular articulation of the transmission with respect to its roll, pitch, and/or yaw axes in simulation of the predetermined test schedule;

g. means for selectively controlling the rotational drive of said input motor to selectively simulate the speed, acceleration, torque, inertia and/or other parameters in simulation of the predetermined test schedule;

h. means for selectively controlling the rotational resistance of said output motor to selectively simulate the speed, deceleration, torque, inertia and/or other aspects of an after-transmission drivetrain of a selected FWD, RWD and/or AWD vehicle according to selected vehicle aerodynamics, vehicle mass, road condition, air/weather conditions, load-carrying, torque mapping and/or other parameters in simulation of the predetermined test schedule;

i. a plurality of speed, torque, temperature, pressure, position, flow rate and/or other sensors operatively arranged to detect various speeds, torques, temperatures, pressures, positions, flow rates, and the like at selected points in said system; and j. means for selectively controlling the shifting of the transmission in response to virtual vehicle speed and virtual throttle position according to a predetermined shift schedule.

19. A method for virtual vehicle testing of an automotive transmission according to a predetermined test schedule which avoids having to install and drive the transmission in a vehicle to perform said testing, said method comprising the steps of:

a. providing a virtual vehicle test system, comprising:
  i. an input motor operatively connectable to an input of the transmission for providing rotational drive thereto;
  ii. an output motor operatively connectable to an output of the transmission for providing rotational resistance thereto;
  iii. an environmental chamber for substantially enclosing the transmission;
  iv. means for selectively controlling the ambient temperature, pressure, and/or humidity within said environmental chamber;
  v. means for selectively controlling the rate/amount of heat rejected by the transmission, including means for selectively controlling the temperature differential between a supply of transmission fluid to the transmission and a return of transmission fluid from the transmission, and/or means for selectively controlling the flow rate of at least said supply of transmission fluid to the transmission;
  vi. means for selectively controlling the angular articulation of the transmission with respect to its roll, pitch, and/or yaw axes in simulation of the predetermined test schedule;
  vii. means for selectively controlling the rotational drive of said input motor to selectively simulate the speed, acceleration, torque, inertia and/or other aspects of an engine according to selected speed, throttle position, torque mapping and/or other parameters in simulation of the predetermined test schedule;
  viii. means for selectively controlling the rotational resistance of said output motor to selectively simulate the speed, deceleration, torque, inertia and/or other aspects of an after-transmission drivetrain of a selected FWD, RWD and/or AWD vehicle according to selected vehicle aerodynamics, vehicle mass, road condition, air/weather conditions, load-carrying, torque mapping and/or other parameters in simulation of the predetermined test schedule;
  ix. a plurality of speed, torque, temperature, pressure, position, flow rate and/or other sensors operatively arranged to detect various speeds, torques, temperatures, pressures, positions, flow rates, and the like at selected points in said system; and
  x. means for selectively controlling the shifting of the transmission in response to virtual vehicle speed and virtual throttle position according to a predetermined shift schedule;

b. installing a transmission into the virtual vehicle test system, such that the input and output of the transmission are operatively connected to the input motor and output motor, respectively;

c. operating the input motor through said means for selectively controlling the rotational drive thereof to simulate a selected engine according to the predetermined test schedule, and operating the output motor through said means for selectively controlling the rotational resistance thereof to simulate a selected vehicle and selected vehicle-affecting conditions according to the predetermined test schedule;

d. permitting the transmission to shift among its various gears according to the predetermined shift schedule in response to the virtual vehicle speed and virtual throttle position; and e. evaluating the performance of the transmission in its execution of said step (d) according to preselected performance criteria.

20. A method according to claim 19, further comprising the steps of:

f. modifying the transmission and/or the predetermined shift schedule; and g. repeating said steps (c), (d), and (e).

21. A method according to claim 20, where said steps (c) through (g) are repeated as needed until the performance of the transmission substantially meets the preselected performance criteria.

22. A process for optimally matching candidate vehicle and engine designs with candidate transmission designs which avoids having to install and drive a corresponding physical transmission in a corresponding physical vehicle having a corresponding physical engine, said process comprising the steps of:

a. selecting a candidate vehicle design and a candidate engine design;

b. obtaining respective performance characteristics for the candidate vehicle and engine designs according to at least one baseline test schedule;

c. selecting a candidate transmission design;

d. selecting a shift schedule for the candidate transmission design;

e. providing a physical transmission corresponding to the candidate transmission design;

f. testing the physical transmission in a virtual vehicle test system which provides:
  i. rotational drive to the input of the transmission in simulation of the performance characteristics of the candidate engine, and
  ii. rotational resistance to the output of the transmission in simulation of the performance characteristics of the candidate vehicle, iii. while permitting the physical transmission to shift among its various gears according to the selected shift schedule in response to virtual vehicle speed and virtual throttle position;

g. evaluating the performance of the physical transmission according to preselected performance criteria;

h. executing at least one step selected from the group comprising:
   i. modifying the physical transmission,
   ii. selecting an alternate candidate vehicle design and obtaining performance characteristics therefor according to the previously selected at least one test schedule,
   iii. selecting an alternate candidate engine design and obtaining performance characteristics therefor according to the previously selected at least one test schedule,
   iv. obtaining new performance characteristics for the candidate vehicle and/or engine design(s) according to an alternate test schedule,
   v. selecting an alternate candidate transmission design and providing an alternate physical transmission corresponding thereto, and
   vi. selecting an alternate shift schedule; and i. repeating at least said steps (f) and (g).

23. A process according to claim 22, wherein said steps (f) through (i) are repeated as needed until the performance of the physical transmission substantially meets the preselected performance criteria.

24. A system for testing an automotive transmission according to a predetermined test schedule which avoids having to install and drive the transmission in a vehicle to perform the testing, comprising:

an input motor operatively contactable to an input of the transmission for providing rotational drive thereto;

an output motor operatively contactable to an output of the transmission for providing rotational resistance thereto;

an environmental chamber for substantially enclosing the transmission;

an environmental controller for controlling ambient conditions in the environmental chamber;

a transmission cooler for controlling the rejection of heat from the transmission; and a test automation system controller operatively connected to said input motor, said output motor, said environmental controller, and said transmission cooler for controlling testing of the transmission.

25. A system according to claim 24, wherein the predetermined test schedule includes gear shifting of the transmission between a plurality of speed ratios.

26. A system according to claim 24, wherein said input motor is a 330 kw, 900 rpm AC motor with an inertia of approximately 0.12 kgm$^2$.

27. A system for testing an automotive transmission and corresponding transmission controller according to a predetermined test schedule which avoids having to install and drive the transmission and corresponding transmission controller in a vehicle to perform said testing, comprising:

a motor operatively connectable to an input of the transmission for providing rotational drive thereto in simulation of the predetermined test schedule;

an output motor operatively connectable to an output of the transmission for providing rotational resistance thereto in simulation of the predetermined test schedule;

an environmental chamber for substantially enclosing the transmission;

an environmental controller for controlling the ambient conditions with said environmental chamber;

a transmission cooler for controlling the rejection of heat from the transmission;

a test automation system controller operatively connected to the input motor, output motor, environmental controller, and transmission cooler, and connectable to the corresponding transmission controller for controlling testing of the transmission; and wherein the predetermined test schedule includes gear shifting of the transmission between a plurality of speed ratios.

* * * * *